United States Patent
Nishikawa et al.

[19]

[11] Patent Number: 6,049,214
[45] Date of Patent: Apr. 11, 2000

[54] UNIVERSAL PRINTED CIRCUIT BOARD INSPECTION APPARATUS, AND METHOD OF USING SAME

[75] Inventors: Hideo Nishikawa; Takashi Miki, both of Uji, Japan

[73] Assignee: Nidec-Read Corporation, Kyoto, Japan

[21] Appl. No.: 08/985,848

[22] Filed: Dec. 5, 1997

[30] Foreign Application Priority Data

May 12, 1996 [JP] Japan .................................. 8-325637

[51] Int. Cl.[7] .................................................. G01R 31/02
[52] U.S. Cl. ............................ 324/754; 324/755; 324/758
[58] Field of Search ................................... 324/754, 755, 324/758, 761, 762, 757

[56] References Cited

U.S. PATENT DOCUMENTS

| | | | |
|---|---|---|---|
| 3,654,585 | 4/1972 | Wickersham | 324/761 X |
| 4,551,675 | 11/1985 | Heys et al. | 324/754 |
| 4,724,383 | 2/1988 | Hart | 324/754 |
| 5,399,982 | 3/1995 | Driller et al. | 324/754 |
| 5,672,978 | 9/1997 | Kimura | 324/754 |
| 5,828,226 | 10/1998 | Higgins et al. | 327/762 |
| 5,883,520 | 3/1999 | Delfosse et al. | 324/755 |

*Primary Examiner*—Josie Ballato
*Assistant Examiner*—T. R. Sundaram
*Attorney, Agent, or Firm*—McCormick, Paulding & Huber LLP

[57] ABSTRACT

An inspection apparatus for determining conductivity between and among inspection points on a printed circuit board. The apparatus comprises a plurality of probes arranged in a predetermined pattern, a translator board including a first set of terminals arranged in the same pattern as that of the probes and a second set of terminals arranged in the same pattern as that of the inspection points on a printed circuit board to be inspected, the first set of terminals being respectively interconnected with corresponding terminals of the second set, the translator board being exchangeably mounted in the apparatus, and interconnecting pins for electrically interconnecting the probes with corresponding terminals of the first set of terminals on the translator board.

8 Claims, 3 Drawing Sheets

UNIVERSAL PRINTED CIRCUIT BOARD INSPECTION APPARATUS, AND METHOD OF USING SAME

FIELD OF THE INVENTION

The present invention relates to a printed circuit board inspection apparatus and, more particularly, to improvement in the versatility of a universal type printed circuit board inspection apparatus.

DESCRIPTION OF THE PRIOR ART

A conventional universal-type printed circuit board inspection apparatus 51 as illustrated in FIG. 5, has an upper jig 2 and a lower jig 3. Upper jig 2 has base 6 on which probes 5 are mounted in matrix or grid arraignment. Board 8 is coupled with base 6 through rods and has through-holes 8a in the same position as that of probes 5. Board 8 is also coupled with lower conversion board 49 through post 47. Lower conversion board 49 is formed with through-holes 49a at positions corresponding to the measuring points on the printed circuit board 19 which is placed on lower jig 3. Test pins 7 are respectively inserted into through-holes 8a and 49a and cooperate with board 49 to convert the matrix arranged probe positions into actual measuring points.

A conductivity test is conducted in the following manner. Lower jig 3 is raised by a lift (not illustrated), bringing the lower ends of test pins 7 into contact with printed circuit board 19 to be tested and the upper ends into contact with probes in upper jig 2. The same happens in lower jig 3.

In such conventional universal-type printed circuit board inspection apparatus 51, various printed circuit boards can be tested by replacing lower conversion board 49 with one having through-holes 49a arranged according to the measuring points of the printed circuit board to be inspected.

Currently, the pitches and spaces between printed circuit patterns have become ever finer so that it is difficult to ensure accurate testing with a conventional universal-type printed circuit board inspection apparatus 51. To cope with this problem, inspection apparatus has been proposed which employs a translator board instead of test pins. (see Japanese patent application no. 54-129211 to Showa). However, problems such as cited below occur when a translator board is mounted in place of test pins on such a conventional universal-type printed circuit board inspection apparatus.

As mentioned, a conductivity test is made with lower jig 3 being raised by a lift (not illustrated). However, a given stroke is established for movement of lower jig 3. Accordingly, if board 8, post 47 and conversion board 49 are removed from the inspection apparatus 51, the preset stroke will be shorter than that required for the inspection.

If, on the other hand, the lifting range of the lower jig 3 is changed to enable testing with a translator board, inspections are then possible only with a translator board. However, some inspections, such as those of relatively coarse pitched printed circuit boards, are more easily and economically accomplished with a conventional test pin system. It is easier and cheaper to manufacture conversion boards 49 having through-holes 49a at given positions than to manufacture translator boards.

Moreover, when a printed circuit board has been inspected, and is to be reinspected, reinspection may be made with a lower conversion board 49, which has been stored and which has through-holes that meet the pattern of the previously inspected printed circuit board. In the case of a reinspection, with a translator board, the board must be remade once the stroke of lifting the lower jig is adjusted.

Accordingly an object of the present invention is to provide a printed circuit board inspection apparatus adapted for inspection of both fine and coarse pattern pitch printed circuit boards.

Another object of the present invention is to provide a printed circuit board inspection apparatus in which a translator board for fine pitch boards and a conversion board for coarse pitch boards may be alternatively used.

A further object of the present invention is to provide a printed circuit board inspection apparatus wherein test pins for interconnecting probes and upper terminals of a translator board are kept disengaged from the translator board while the apparatus is in a rest condition.

A still further object of the present invention is to provide a printed circuit board inspection apparatus wherein test pins for interconnecting probes and upper terminals of a translator board are kept disengaged from the probes while the apparatus is in a rest condition.

SUMMARY OF THE INVENTION

According to one aspect of the present invention, an inspection apparatus for inspecting conductivity between and among inspection points on a printed circuit board comprises a plurality of probes arranged in a predetermined pattern, a translator board including a first set of terminals arranged in the same pattern as that of the probes and a second set of terminals arranged in the same pattern as that of the inspection points on a printed circuit board to be inspected, the first set of terminals being respectively interconnected with corresponding terminals of the second set, the translator board being exchangeably mounted in the apparatus, and interconnecting pins for electrically interconnecting the probes with corresponding terminals of the first set of the translator board.

With the apparatus of the present invention, a conventional conversion board as shown in FIG. 5 can be exchanged with a translator board and used without substantially changing the stroke of a lift which elevates the printed circuit board to the position to be inspected. The conversion board has through holes arranged to correspond to the inspection points on the printed circuit board and respectively receive the interconnecting pins such that the pins may be brought into contact with the inspection points.

According to another aspect of the present invention, a board is provided for supporting the interconnecting pins and the supporting board is biased to keep the tips of the interconnecting pins free of the translator board while the apparatus is at rest.

According to a further embodiment of the present invention, a guide plate has a plurality of through-holes for directing the interconnecting pins to the first set of terminals of the translator board. The guide plate may be coupled with the translator board with or with out space therebetween. The assembly of the guide plate and translator board may b exchanged with the conventional conversion board.

Further, according to the embodiment of the present invention, three plates work as a guide plate. A first plate has a plurality of through holes each of which has a diameter substantially the same as that of the interconnecting pin to receive the latter in a smooth fitting manner. A second plate has a plurality of through holes each of which is slightly larger than that of the interconnecting pins for loosely fitting the pins, thus allowing a slight lateral displacement of the second plate relative to the pins. A third plate integrally couples with the second plate and a translator board and is driven therewith to adjust the same horizontally relative to the pins.

According to this embodiment of the present invention, each tip of the interconnecting pins is loosely received by a corresponding through-hole of the guide plate with a distance from the translator board while the apparatus is at rest.

The above and other objects, features and advantages of the present invention will be apparent from the following detailed description of the preferred embodiments of the present invention in conjunction with the accompanying drawings.

DETAILED DESCRIPTION OF THE PREFERRED EMBODIMENTS

Figure 1:
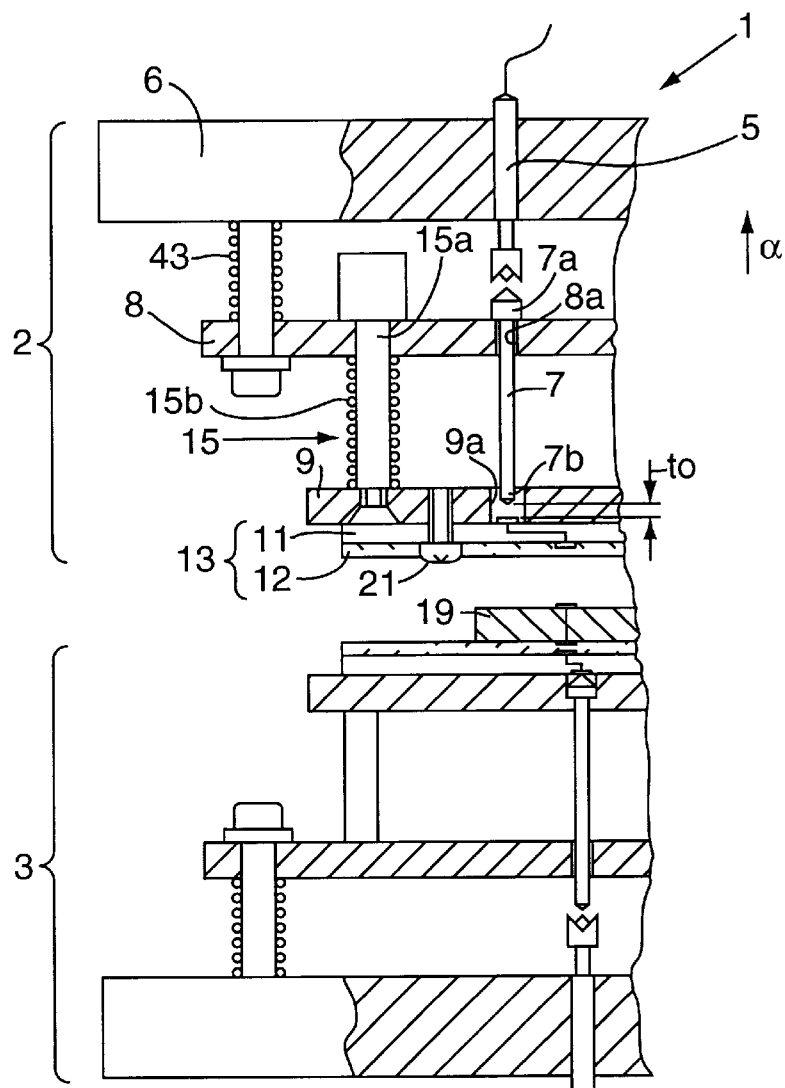
FIG. 1 is a schematic illustration partially in cross-section of a printed circuit board inspection apparatus 1 forming an embodiment of the present invention.

A first embodiment of the present invention is described with reference to FIG. 1 which schematically illustrates a printed circuit board inspection apparatus 1 according to the present invention.

Printed circuit board inspection apparatus 1 has an upper jig 2 and a lower jig 3. Upper jig 2 has a base 6 on which probes 5 are mounted in matrix or grid arrangement. Board 8 is coupled with base 6 through a rod on which spring 43 is wound. Board 8 has through-holes 8a arranged in matrix arrangement and board 9 also has through-holes 9a, which are at the same positions a those of through-holes 8a. Test pins 7 extend through holes 8a and 9a. In the present embodiment, test pin 7 has a diameter of 0.4 mm, and through-holes 8a and 9a have respectively a diameter of 0.5 mm and 9a is larger than 8a. Heads 7a of test pins 7 are enlarged so as to be retained on the upper side of board 8.

Pin raiser 15 is interposed between boards 8 and 9 and includes a body 15a and spring 15b. Spring 15b urges board 8 in the direction of the arrow α and away from board 9. Thus, enlarged head 7a of test pin 7 is lifted in the direction of the arrow α, with tip 7b of test pin 7 being kept form contacting the upper surface of translator board 13 through clearance t0. Translator board 13 is fixed to board 9 with screws 21.

Figure 2:
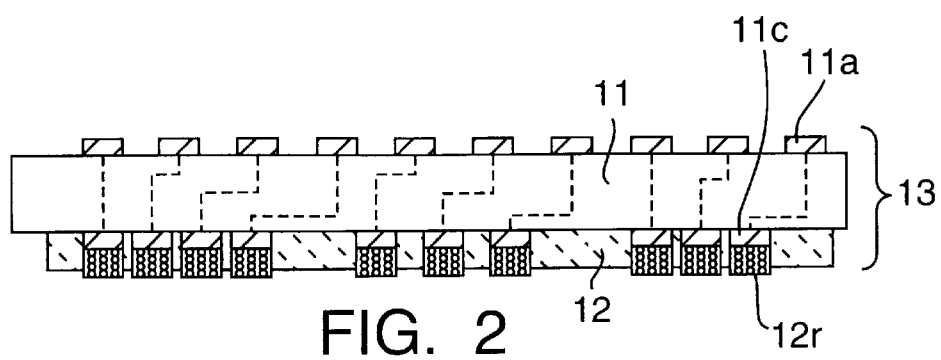
FIG. 2 is a cross-sectional view of a main portion of a translator board.

With particular reference to FIG. 2, translator board 13 is used for inspection of printed circuit boards of electrical conductor patterns with pitches finer than those between the probes of a conventional universal-type jig. The translator board 13 includes inspection electrodes 11c arranged to match the electrical conductor pattern of a printed circuit board to be inspected. Board 13 also includes converter 11 and an electrically conductive rubber portion 12. Converter 11 is provided with electrodes 11a on the probe side and electrodes 11c on the inspection side. Electrodes 11c on the inspection side are provided with electrically conductive rubber portion 12, which has non-uniformly arranged PCR parts 12r. "Offgrid Adapter JP2000" manufactured by JSR Nippon Synthetic Rubber Co., Ltd. is used as a translator board 13 in the present embodiment.

In conducting an inspection, printed circuit board 19 to be inspected is mounted on lower jig 3 in a conventional manner. With the structure as mentioned above, pin raiser 15 between boards 8 and 9 prevents tip 7b from coming into contact with the measuring points of translator board 13 when the apparatus is at rest and no inspection occurs. At this time, the weight of test pin 7 is kept from impinging on translator board 13, thus preventing warping or damage of the latter.

Through-holes 8a and 9a are designed to be slightly larger in diameter than test pins 7. Pitches are converted by translator board 13, and test pins 7 can be held almost vertical, avoiding the problem that tips of the test pins may contact translator board 13 at points displaced from predetermined positions.

Figure 3:
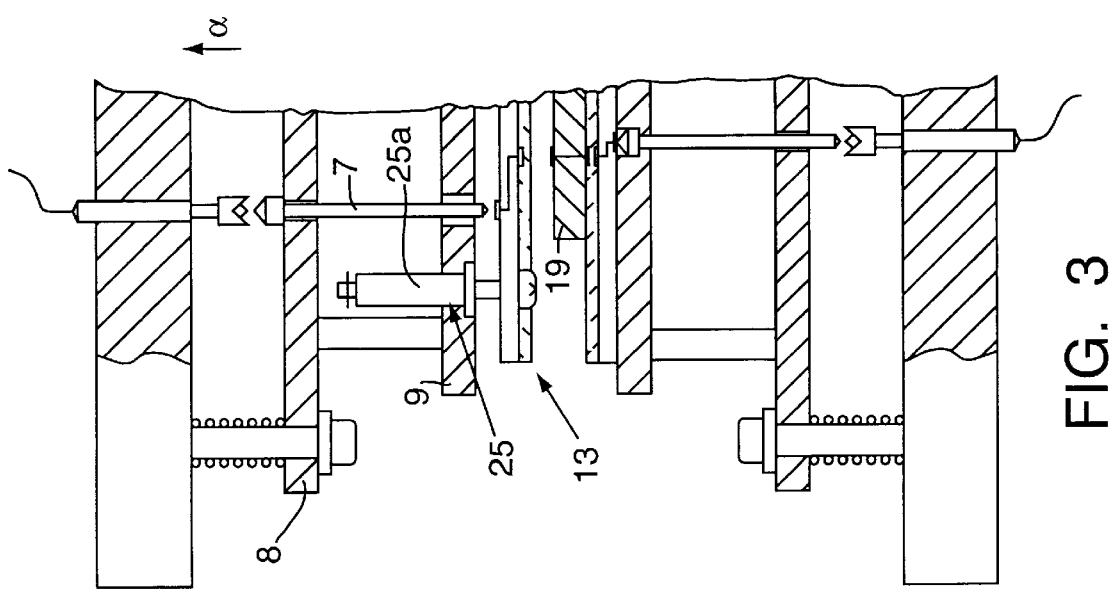
FIG. 3 is a partially cross-sectional schematic illustration of an embodiment using a translator lowering device 25.

In the above mentioned embodiment, pin raiser 15 urges board 8 in the direction of the arrow α from board 9. It is also possible that translator lowering device 25 in FIG. 3, urges translator board 13 in the direction opposite to the arrow α. Within its body 25a, translator lowering device 25 incorporates a spring (not illustrated), which urges translator board 13 downwardly and away from board 9.

Figure 5:
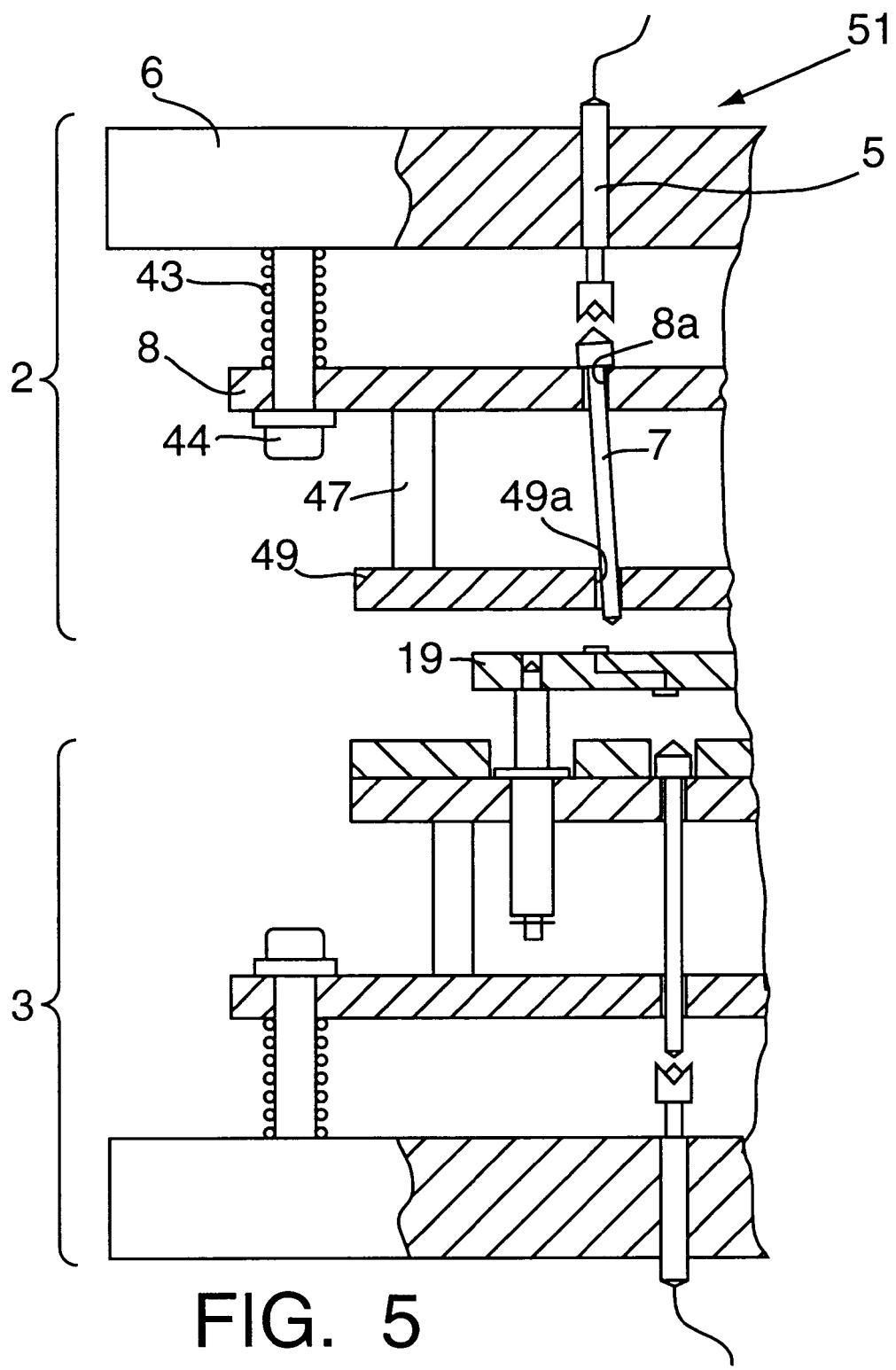
FIG. 5 is a partially cross-sectional schematic illustration of a conventional universal-type printed circuit board inspection apparatus 51 found in the prior art.

On upward movement of the lower jig 3, inspection is accomplished as in the prior art apparatus of FIG. 5 described above.

Figure 4:
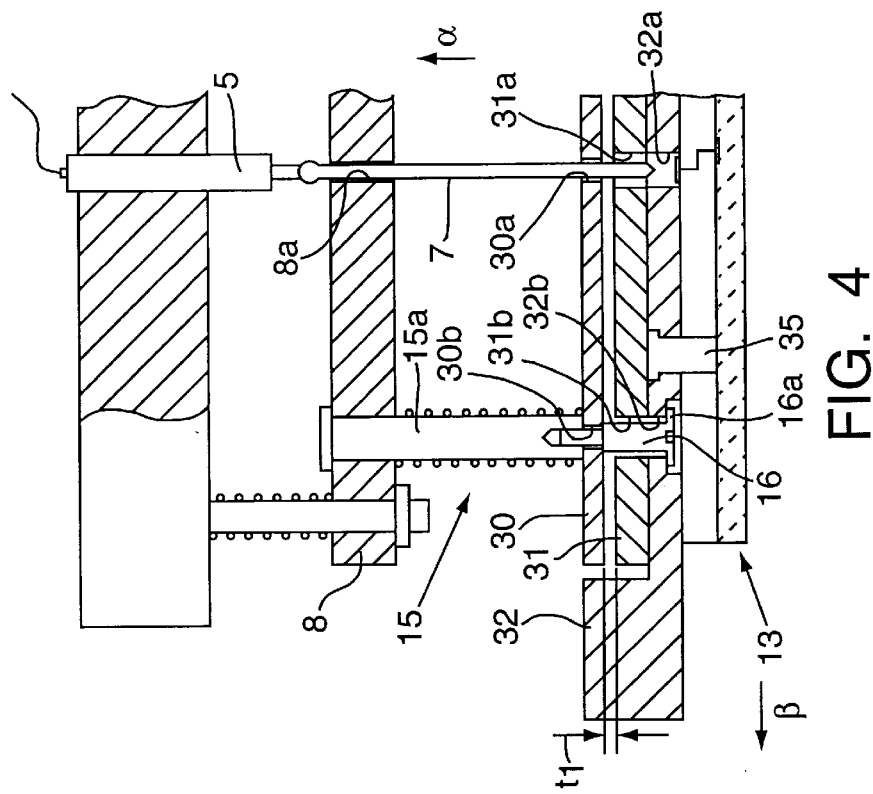
FIG. 4 is a partially cross-sectional schematic illustration of another embodiment of the present invention which employs a position adjusting mechanism.

Now with reference to FIG. 4, an embodiment of the inspection apparatus will be described in which the position of a translator board 13 can be fine-adjusted horizontally relating to printed circuit board 19 to be inspected. In this embodiment, an assembly corresponding to board 9 in FIG. 1 is composed of three boards 30, 31, and 32. Board 8 is formed with through-holes 8a respectively to receive test pins 7, as in the embodiment shown in FIG. 1. Board 30 is formed with through-holes 30a that respectively receive test pins 7 in the same manner as with board 8. Each test pin 7 is 0.4 mm in diameter, and each of through-holes 8a and 30a is 0.5 mm in diameter. Boards 31 and 32 are respectively formed with through-holes 31a and 32a, which are slightly larger in diameter than test pins 7. In the present embodiment, with the diameter of test pins 7 0.4 mm, the diameter of through-holes 31a and 32a is 0.8 mm.

As in the embodiment shown in FIG. 1, a pin raiser 15 is provided between boards 8 and 30 to urge board 8 upwardly in the direction of the arrow α. Board 30 is also formed with through-holes 30b and boards 31 and 32 have enlarged through-holes 31b and 32b, respectively. Board 32 is formed with a recess of a diameter larger than that of head 16a of drop preventing screw 16. Screw 16 is loosely received by through-holes 31b and 32b, and the male end of the screw extends through holes 30b of board 30, and is screwed into pin raiser 15 to retain boards 31 and 32 on the board 30.

As stated, through-holes 31b and 32b loosely receive drop preventing screw 16, and boards 31 and 32 are suspended with a slight clearance t1 from board 30. Thus, boards 31 and 32 can be moved horizontally relative to board 30 in the direction of arrow β.

Positioning pin 35 retains translator board 13 and board 32 in assembled position. A drive (not shown) can move board 32 in the direction of the arrow β or in an opposite direction. As shown, test pin 7 has a diameter of 0.4 mm, and through-holes 31a and 32a have diameters of 0.8 mm. Thus, board 32 can move by 0.2 mm to the right or left.

When the drive (not shown) moves board 32 in the direction of arrow or oppositely, translator board 13 moves with board 32. Test pin 7 is held in a fixed vertical position, as through-holes 31a and 32a are larger in diameter than test pin 7. Thus, without moving the entire upper jig, translator board 13 is easily positioned in a precise manner relative to printed circuit board 19 to be inspected.

Further, the tips of test pins 7 are elevated from the patterns of translator board 13 in this embodiment so that the pattern will not be damaged when translator board 13 moves horizontally. Thus, instead of providing a conversion board 49 as shown in FIG. 5, test pins 7 can be held in fixed vertical positions by providing through holes 30a and loose through holes 31a and 32a at the same positions as those of through-holes 9a in FIG. 1, and translator board 13 can be employed for pitch conversion. As will be seen, this embodiment accommodates two types of inspection, one of which employs translator board 13 in a conventional universal type printed circuit board such as inspection apparatus 51, and the other of which uses test pins 7 without a translator board 13.

In the present embodiment, test pins 7 are fixed vertically extending through holes 8a and 30a. Accordingly, the embodiment is free from the problem that the tips of test pins 7 displace from inspection points when they engage a printed circuit board to be tested.

Further, although test pins 7 are held vertically in the present embodiment, they may be arranged to be held obliquely as in a conventional way, with pitches being reconverted by a translator board 13.

As test pin 7 is not removed in this embodiment, an inspection using a translator board can be done with a conventional printed circuit board inspection apparatus, without changing the shape of the tip of the probe.

It should also be apparent that the position of a translator board 13 can be adjusted, by slightly moving boards 31 and 32 horizontally (in X, Y and θ directions) with the board 32 connected with a drive. Board 8 may also be connected with a drive to adjust the horizontal positions of boards 8, 30, 31 and 32. In this case, if at least through-holes 8a are made loose, displacement of probe 5 can be absorbed. Other through-holes 30a, 31a and 32a may be either loose holes or fitting holes.

While the invention has been particularly shown and described with reference to preferred embodiments thereof, it will be understood by those skilled in the art that the foregoing and other changes in form and details can be made therein without departing from the spirit and scope of the invention.

What is claimed is:

1. An inspection apparatus for determining conductivity between and among inspection points on a printed circuit board, said apparatus comprising:

a plurality of probes arranged in a pre-determined basic grid pattern;

a translator board including a first set of terminals arranged in the same pattern as that of the probes and a second set of terminals arranged in the same pattern as that of the inspection points on a printed circuit board to be inspected, the first set of terminals being respectively electrically interconnected with corresponding terminals of the second set, the translator board being exchangeably mounted in the apparatus;

interconnecting pins for electrically interconnecting the probes with corresponding terminals of the first set of the terminals of the translator board;

a supporting board including a plurality of through-holes arranged in a predetermined basic grid pattern for supporting the interconnecting pins, each head of the interconnecting pins being enlarged so as to be held on the upper side of the supporting board and a diameter of each through-hole being larger than a diameter of the interconnecting pin, and a member for biasing the supporting board to displace the tips of the interconnecting pins from the translator board while the apparatus is at rest.

2. A printed circuit board inspection apparatus according to claim 1, further comprising a guide plate including a plurality of through-holes for guiding the interconnecting pins to the first set of terminals of the translator board, said guide plate being coupled with the translator board.

3. A printed circuit board inspection apparatus according to claim 1, further comprising a first plate having a plurality of through holes each of which has a diameter substantially the same as that of the interconnecting pin to receive the latter in a smooth fitting manner;

a second plate having a plurality of through holes each of which is slightly larger than that of the interconnecting pins for loosely fitting the pins to allow slight lateral displacement of the second plate relative to the pins, said second plate loosely coupled with the translator board for adjusting the second plates and the translator board laterally relative to the pins.

4. A printed circuit board testing apparatus for testing conductivity between and among inspection points on a printed circuit board, said apparatus comprising:

a translator board including a first set of terminals arranged in the same pattern as that of the probes and a second set of terminals arranged in the same pattern as that of the inspection points on a printed circuit board to be inspected, the first set of terminals being respectively electrically interconnected with corresponding terminals of the second set, interconnecting pins for electrically interconnecting the probes with corresponding terminals of the first set of the terminals of the translator board;

a supporting board including a plurality of through-holes arranged in the same grid pattern as that of the probes and respectively loosely receiving the interconnecting pins such that the interconnecting pins suspend from the supporting board;

a spring biased spacer for spacing the supporting board from the translator board such that the lower tip of each connecting pin is spaced apart from the translator board with the apparatus at a non-testing condition, each connecting pin being brought into contact with the translator board with the apparatus at a testing condition.

5. A printed circuit board testing apparatus according to claim 4, further comprising an intermediate board having a plurality of through-holes arranged in the same grid pattern as that of the probes and receiving the free ends of corresponding interconnecting pins, said translator board being attached to the intermediate board such that the first set of terminals respectively coincide with the through-holes of the intermediate board, and wherein a spacer is disposed between the supporting board and the intermediate board.

6. A printed circuit board testing apparatus according to claim 4, further comprising an intermediate board having a plurality of through-holes arranged in the same grid pattern as that of the probes and receiving the free ends of corresponding interconnecting pins, said translator board being attached to the intermediate board such that the first set of terminals respectively coincide with the through-holes of the intermediate board, and wherein a spacer is between the intermediate board and the translator board.

7. A method of testing conductivity between and among inspection points on a printed circuit board, with a universal type printed circuit board testing apparatus including a plurality of probes arranged in a pre-determined grid pattern, a plurality of interconnecting pins each of which has a head to be in contact with corresponding probe and a lower free ends, and a supporting board for suspending interconnecting pins, comprising the steps of:

attaching a translator board to the apparatus, the translator board including a first set of terminals arranged in the same pattern as that of the probes and a second set of terminals arranged in the same pattern as that of the inspection points on a printed circuit board to be inspected, the first set of terminals being respectively electrically interconnected with corresponding terminals of the second set;

biasing the supporting board to space the lower free end of each interconnecting pin from the translator board while the apparatus is at rest; and bringing the circuit board into engagement with the translator board which in turn is brought into engagement with the free ends of the interconnecting pins such that the inspection points on the circuit board are electrically connected with corresponding probes.

8. The method according to claim 7, further comprising the steps of:

replacing the translator board with a conversion board having through-holes arranged in the pattern corresponding to that of the inspection points; and inserting the free ends of the interconnecting pins into corresponding through-holes of the conversion board.

\* \* \* \* \*